United States Patent
Okazaki

(10) Patent No.: US 7,133,122 B2
(45) Date of Patent: Nov. 7, 2006

(54) EXPOSURE METHOD

(75) Inventor: Yoji Okazaki, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 11/330,099

(22) Filed: Jan. 12, 2006

(65) Prior Publication Data

US 2006/0119831 A1    Jun. 8, 2006

Related U.S. Application Data

(63) Continuation of application No. 10/859,087, filed on Jun. 3, 2004, now Pat. No. 7,016,018.

(30) Foreign Application Priority Data

Jun. 4, 2003    (JP) .............................. 2003-159084

(51) Int. Cl.
*G03B 27/32* (2006.01)
*G03B 27/42* (2006.01)

(52) U.S. Cl. ............................................ 355/77; 355/53

(58) Field of Classification Search ................. 355/53, 355/55, 67–71, 77; 385/27, 33, 49
See application file for complete search history.

(56) References Cited

U.S. PATENT DOCUMENTS

| 6,078,708 | A | 6/2000 | de la Tocnay et al. |
| 6,379,867 | B1 | 4/2002 | Mei et al. |
| 6,424,404 | B1 * | 7/2002 | Johnson .................. 355/44 |
| 6,515,257 | B1 * | 2/2003 | Jain et al. ............ 219/121.73 |
| 6,876,494 | B1 * | 4/2005 | Ishikawa et al. .......... 359/618 |
| 7,016,018 | B1 * | 3/2006 | Okazaki ..................... 355/67 |
| 2003/0010889 | A1 | 1/2003 | Igasaki et al. |

FOREIGN PATENT DOCUMENTS

| JP | 2000-228554 A | 8/2000 |
| JP | 2002-123965 A | 4/2002 |

* cited by examiner

*Primary Examiner*—Henry Hung Nguyen
(74) *Attorney, Agent, or Firm*—Sughrue Mion, PLLC

(57) ABSTRACT

An exposure method that can conduct digital exposure with high precision and with a high light-use efficiency using evanescent light. Light that is modulated by a DMD and condensed by a microlens array is incident at corresponding optical fiber cores arranged in a matrix in an evanescent array head, and is guided through the insides of the optical fibers. Because the light condensed by the microlens array is incident at the optical fiber cores corresponding to the microlenses, the light can be efficiently incident. Evanescent light leaks out from micro-openings formed in emission-side end portions of the optical fibers, and a photosensitive material is exposed by this evanescent light.

9 Claims, 13 Drawing Sheets

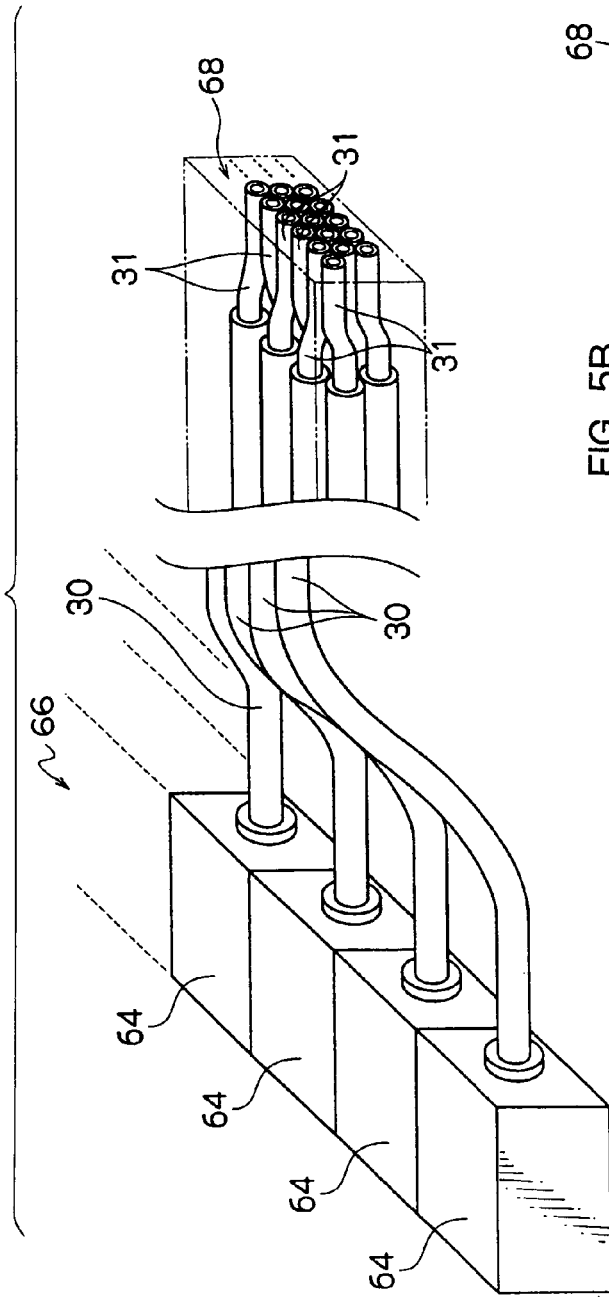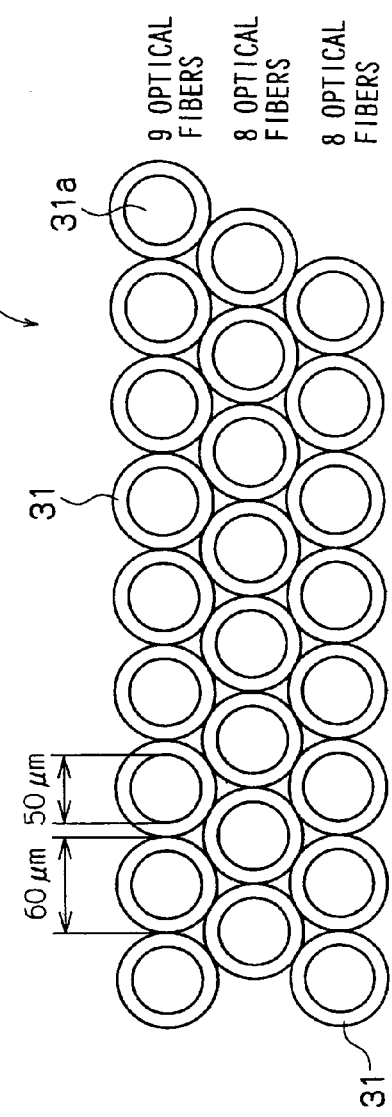

EXPOSURE METHOD

CROSS-REFERENCE TO RELATED APPLICATION

This is a continuation of application Ser. No. 10/859,087 filed Jun. 3, 2004 now U.S. Pat. No. 7,016,018. The entire disclosure of the prior application, application Ser. No. 10/859,087 is considered part of the disclosure of the accompanying continuation application and is hereby incorporated by reference.

This application claims priority under 35 USC 119 from Japanese Patent Application No. 2003-159084, the disclosure of which is incorporated by reference herein.

BACKGROUND OF THE INVENTION

1. Field of the Invention

The present invention relates to an exposure device, and in particular to an exposure device that conducts digital exposure with high precision using evanescent light.

2. Description of the Related Art

In recent years, various evanescent light heads that conduct high-density recording and microfabrication using evanescent light have been proposed. For example, an exposure head has been proposed where micro-openings are formed in tapered tips of optical fibers and laser light is introduced from the other ends to expose a photosensitive material using evanescent light leaking out from the micro-openings (Japanese Patent Application Laid-Open Publication (JP-A) No. 2002-123965, paragraphs 38–39, and FIG. 8). In this exposure head, optical fiber cores are two-dimensionally arranged, and laser light is introduced to the optical fiber cores of positions corresponding to the bit pattern of information to be written. Also, as a light head whose manufacture is simple, an evanescent light head where a light-blocking film including micro-openings is disposed at the light-emitting side of a lens array has been proposed (JP-A No. 2000-228554).

However, JP-A No. 2002-123965 does not disclose specific means for introducing the laser light to the optical fiber cores of the positions corresponding to the bit pattern of the information. The diameter of the optical fiber cores is about several microns, and there is the problem that it is difficult to introduce the laser light to each of the two-dimensionally arranged optical fiber cores with a high coupling efficiency.

JP-A No. 2000-228554 also does not disclose specific means for introducing the laser light to the lens array. In this case also, it is difficult to match the optical axes to each lens of the lens array and introduce the laser light thereto.

SUMMARY OF THE INVENTION

The present invention has been devised in light of the aforementioned problem. The present invention relates to providing an exposure device that can conduct digital exposure with high precision and with a high light-use efficiency using evanescent light.

An exposure device of a first aspect of the invention includes: a light source that emits light beams for illumination; a spatial light modulator in which plural pixel portions whose respective light modulation states change in correspondence to control signals are two-dimensionally arranged and which modulates, per pixel portion, the light beams that are incident at the plural pixel portions from the light source; a microlens array in which plural microlenses are two-dimensionally arranged at a pitch corresponding to the plural pixel portions and which condenses, per microlens, the light beams modulated by the pixel portions; and a head portion where incident ends of plural optical fibers whose emission ends are tapered are two-dimensionally arranged at a pitch corresponding to condensing positions of the plural microlenses, wherein a photosensitive material is exposed by evanescent light leaking out from the emission ends of the plural optical fibers.

In the exposure device of the first aspect of the invention, the light beams that are incident at the spatial light modulator from the light source are modulated per pixel portion of the spatial light modulator, and the light beams modulated by the pixel portions are condensed per microlens of the microlens array.

The incident ends of the plural optical fibers are two-dimensionally arranged in the head portion at a pitch corresponding to the condensing positions of the plural microlenses. Thus, the light beams that are modulated per pixel portion of the spatial light modulator and condensed by the microlens array are effectively made incident at the incident ends of the plural optical fibers arranged in the head portion. The emission ends of the plural optical fibers are tapered, and a photosensitive material is exposed by evanescent light leaking out from the tapered emission ends. Therefore, digital exposure can be conducted with high precision and with a high light-use efficiency using the evanescent light.

An exposure device of a second aspect of the invention includes: a light source that emits light beams for illumination; a spatial light modulator in which plural pixel portions whose respective light modulation states change in correspondence to control signals are two-dimensionally arranged and which modulates, per pixel portion, the light beams that are incident at the plural pixel portions from the light source; a microlens array in which plural microlenses are two-dimensionally arranged at a pitch corresponding to the plural pixel portions and which condenses, per microlens, the light beams modulated by the pixel portions; and a light-blocking film disposed on a light-emitting surface of the microlens array, the light-blocking film having plural micro-openings which are two-dimensionally arranged at a pitch corresponding to condensing positions of the plural microlenses, wherein a photosensitive material is exposed by evanescent light leaking out from the plural micro-openings.

In the exposure device of the second aspect of the invention, the light beams that are incident at the spatial light modulator from the light source are modulated per pixel portion of the spatial light modulator, and the light beams modulated by the pixel portions are condensed per microlens of the microlens array. The light-blocking film, in which the plural micro-openings are two-dimensionally arranged at a pitch corresponding to the condensing positions of the plural microlenses, is disposed on the light-emitting surface of the microlens array. Thus, the light beams that are modulated per pixel portion of the spatial light modulator are effectively made incident at the microlenses.

The light-blocking film, in which the plural micro-openings are two-dimensionally arranged at a pitch corresponding to the condensing positions of the plural microlenses, is disposed on the light-emitting surface of the microlens array. A photosensitive material is exposed by evanescent light leaking out from these plural micro-openings. Therefore, digital exposure can be conducted with high precision and with a high light-use efficiency using the evanescent light.

An exposure device of a third aspect of the invention includes: a light source that emits light beams for illumination; a spatial light modulator in which plural pixel portions whose respective light modulation states change in correspondence to control signals are two-dimensionally arranged and which modulates, per pixel portion, the light beams that are incident at the plural pixel portions from the light source; a first microlens array in which plural first microlenses are two-dimensionally arranged at a pitch corresponding to the plural pixel portions and which condenses, per first microlens, the light beams modulated by the pixel portions; a light guide where incident ends of plural optical fibers are two-dimensionally arranged at a pitch corresponding to condensing positions of the plural first microlenses; a second microlens array in which plural second microlenses are two-dimensionally arranged at a pitch corresponding to emission ends of the plural optical fibers and which condenses, per second microlens, the light beams emitted from the plural optical fibers; and a light-blocking film disposed on a light-emitting surface of the second microlens array, the light-blocking film having plural micro-openings which are two-dimensionally arranged at a pitch corresponding to condensing positions of the plural second microlenses, wherein a photosensitive material is exposed by evanescent light leaking out from the plural micro-openings.

In the exposure device of the third aspect of the invention, the light beams that are incident at the spatial light modulator from the light source are modulated per pixel portion of the spatial light modulator, and the light beams modulated by the pixel portions are condensed per first microlens of the first microlens array. The incident ends of the plural optical fibers are two-dimensionally arranged in the light guide at a pitch corresponding to the condensing positions of the plural first microlenses. The light beams that are modulated per pixel portion of the spatial light modulator and condensed by the first microlens array are effectively made incident at the incident ends of the plural optical fibers arranged in the light guide and are guided.

The plural second microlenses are two-dimensionally arranged in the second microlens array at a pitch corresponding to the emission ends of the optical fibers. The light beams guided by the light guide are condensed per second microlens of the second microlens array. Thus, the light beams are effectively made incident at the second microlenses. The light-blocking film, in which the plural micro-openings are two-dimensionally arranged at a pitch corresponding to the condensing positions of the plural second microlenses, is disposed on the light-emitting surface of the second microlens array. A photosensitive material is exposed by evanescent light leaking out from these plural micro-openings. Therefore, digital exposure can be conducted with high precision and with a high light-use efficiency using the evanescent light.

BRIEF DESCRIPTION OF THE DRAWINGS

FIG. 5A is a perspective view showing the configuration of a fiber array light source, and FIG. 5B is a plan view showing the arrangement of light-emitting points in a laser emission portion of FIG. 5A;

DETAILED DESCRIPTION OF THE INVENTION

Embodiments of the invention will be described in detail below with reference to the drawings.

[First Embodiment]

(Schematic Configuration of Exposure Device)

Figure 1:
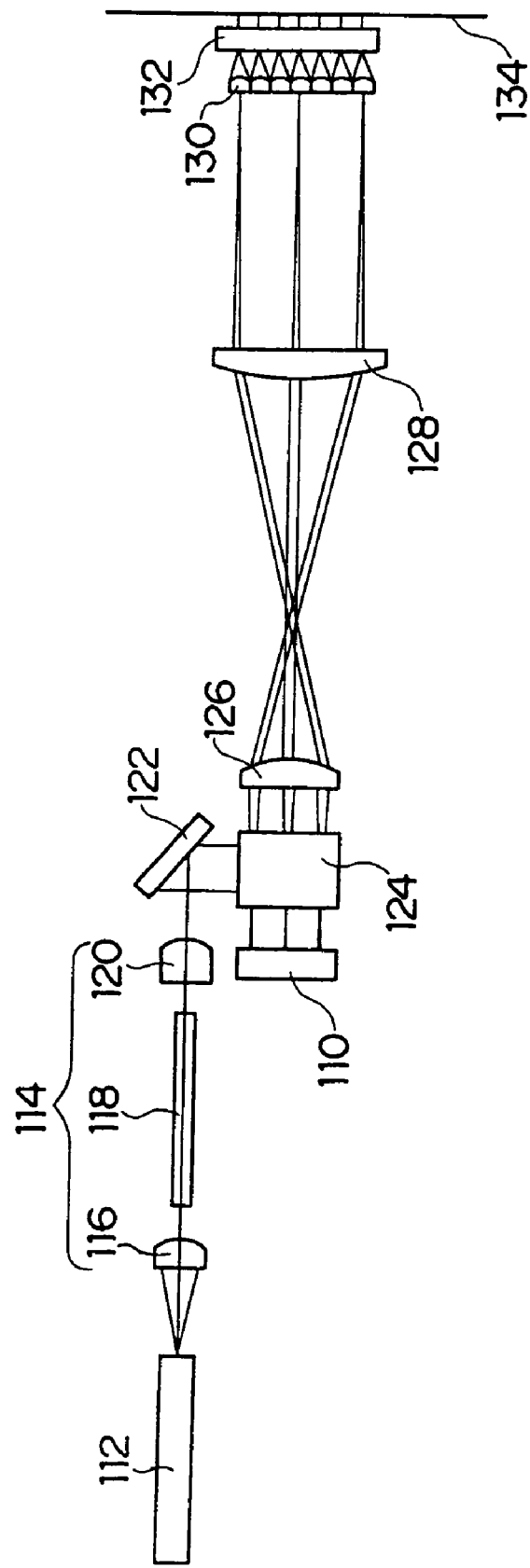
FIG. 1 is a cross-sectional view, along an optical axis, showing the configuration of an exposure device according to a first embodiment.

As shown in FIG. 1, an exposure device according to a first embodiment of the present invention is provided with a digital micromirror device (DMD) 110 as a spatial light modulator that modulates incident light beams per pixel in correspondence to image data. The DMD 110 is connected to an unillustrated controller provided with a data processor and a mirror drive controller. The data processor of the controller generates control signals that drive/control the micromirrors of the DMD 110 on the basis of inputted image data. The mirror drive controller controls the angles of reflection surfaces of the micromirrors of the DMD 110 on the basis of the control signals generated by the image data processor. The control of the angles of the reflection surfaces will be described later.

Disposed in the following order at the light-incident side of the DMD 110 are a fiber array light source 112 provided with a laser emission portion where emission-end portions (light-emitting points) of optical fibers are arranged in one row along a predetermined direction, a lens system 114 that corrects laser light emitted from the fiber array light source 112 and condenses the laser light onto the DMD, and mirrors 122 and 124 that reflect, towards the DMD 110, the laser light transmitted through the lens system 114.

The lens system 114 is configured by a pair of combination lenses 116 that make parallel the laser light emitted from the fiber array light source 112, a rod integrator 118 that corrects the laser light so that the light amount distribution of the parallel laser light becomes uniform, and a condenser lens 120 that condenses, onto the DMD, the laser light whose light amount distribution has been corrected. The rod integrator 118 can correct the laser light so that the light amount distribution becomes uniform because the light is guided through the inside the integrator as it is completely reflected.

Magnification lens systems 126 and 128, which magnify a DMD image reflected by the DMD 110, are disposed at the light-reflecting side of the DMD 110. A microlens array 130, in which microlenses are disposed in correspondence to the pixels of the DMD, is disposed at a position where the DMD image is imaged by the magnification lens systems 126 and 128. An evanescent array head 132 is disposed at the light-emitting side of the microlens array 130. The evanescent array head 132 is disposed adjacent to the surface of a photosensitive material 134 so as to expose the photosensitive material 134 with evanescent light.

Figure 2:
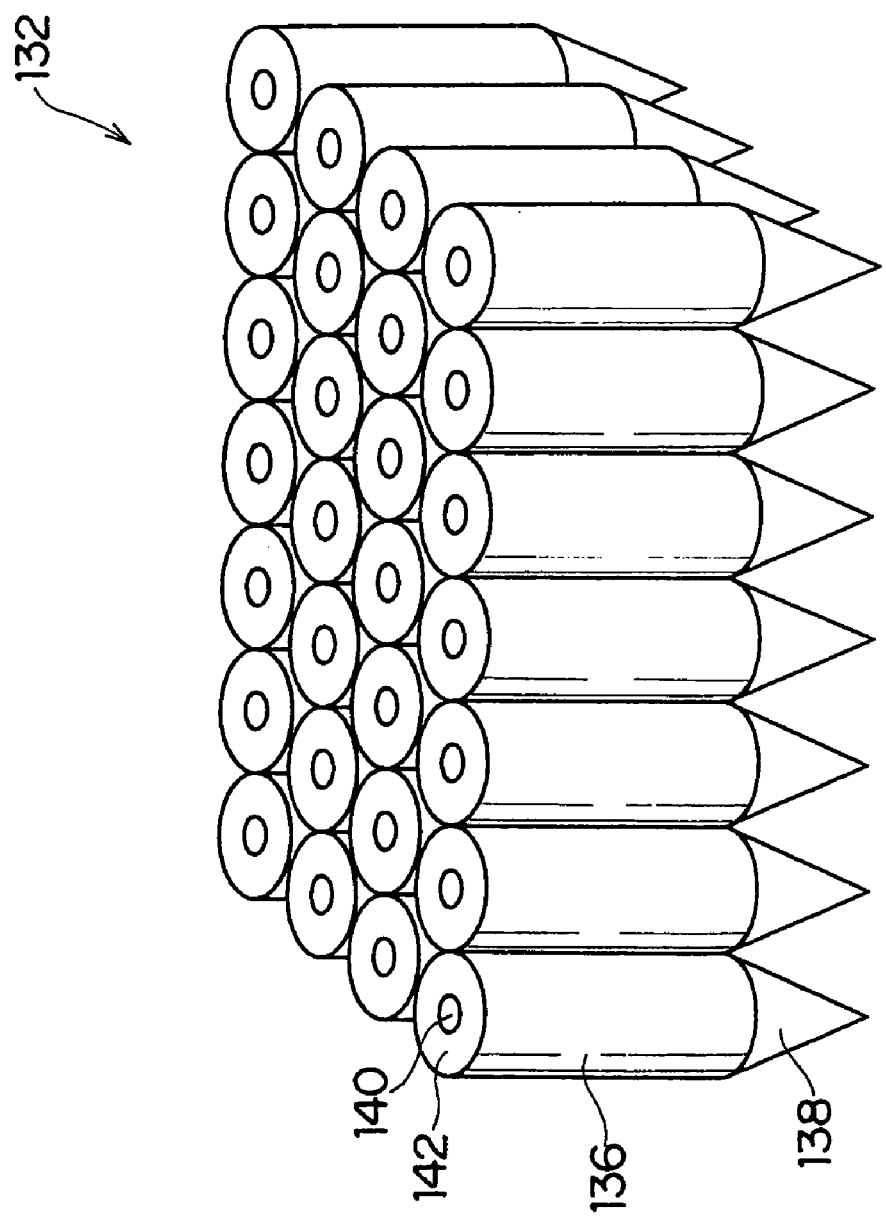
FIG. 2 is a perspective view showing the configuration of an evanescent array head used in the exposure device shown in FIG. 1.

As shown in FIG. 2, the evanescent array head 132 is configured by plural optical fibers 136 that are provided with cores 140 and claddings 142 and are bundled together. At the incident ends of the optical fibers 136, the cores 140 are arranged in a matrix in correspondence to condensing positions of the microlens array 130. Emission-side end portions 138 of the optical fibers 136 are tapered to diameters of about several tens to several hundreds of nm, and micro-openings are formed in the tips thereof. When laser light is introduced from the other ends of the optical fibers 136, evanescent light leaks out from the micro-openings.

Although an example is shown in FIG. 2 where twenty-eight optical fibers 136 are bundled together and the cores 140 thereof are arranged in a matrix having four rows and seven columns, in actuality the evanescent array head 132 is configured by bundling together optical fibers 136 of the same number as that of the microlenses arranged in the microlens array 130.

Figure 3:
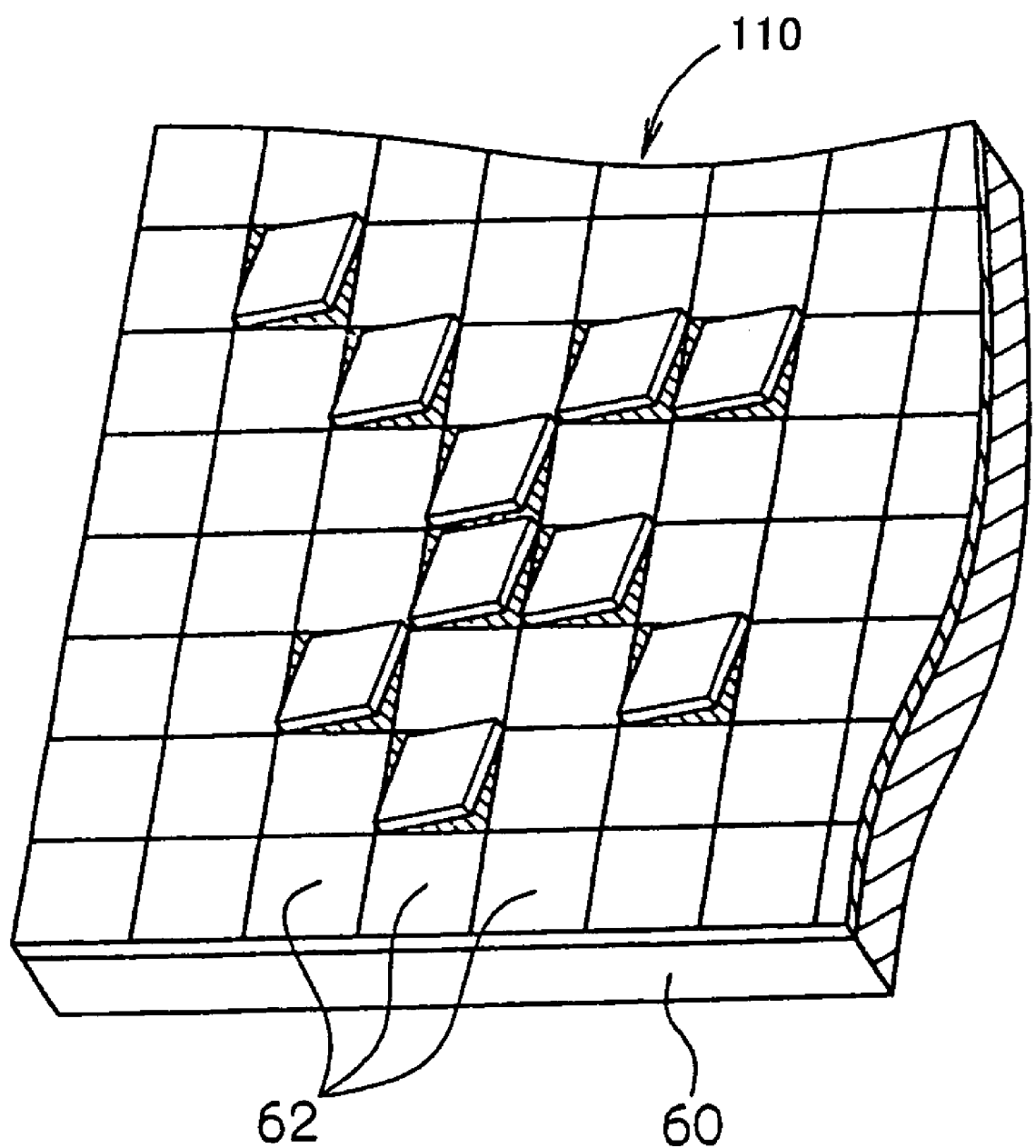
FIG. 3 is a partially enlarged view showing the configuration of a DMD.

As shown in FIG. 3, in the DMD 110, micromirrors 62 are supported by supports and disposed on a SRAM cell (memory cell) 60. The DMD 110 is a mirror device configured by numerous (e.g., 600×800) micromirrors configuring pixels that are arranged in a grid. The micromirrors 62 supported by supports are disposed at the uppermost portion of each pixel, and a material having a high reflectivity, such as aluminium, is deposited on the surfaces of the micromirrors 62. The reflectivity of the micromirrors 62 is 90% or higher. Also, disposed directly below the micromirrors 62 via the supports including a hinge and a yoke is the SRAM cell 60 of a CMOS silicon gate produced in a production line of semiconductor memories in general.

Figure 4A:
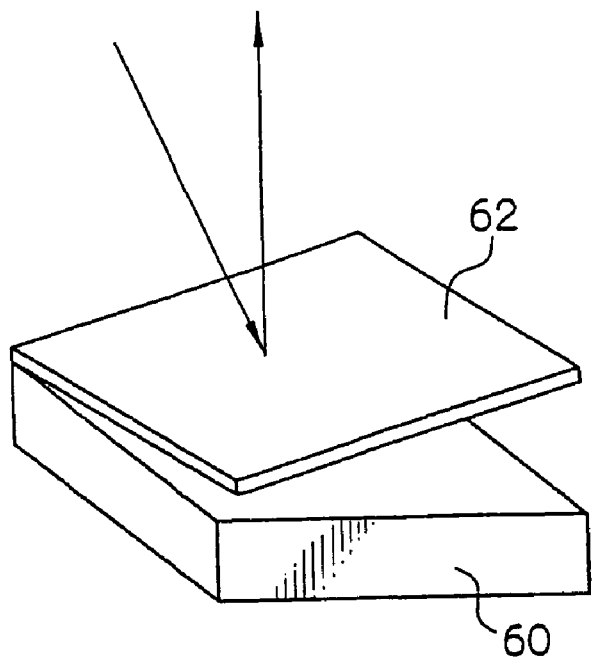
FIGS. 4A and 4B are schematic views for describing the operation of the DMD.
Figure 4B:
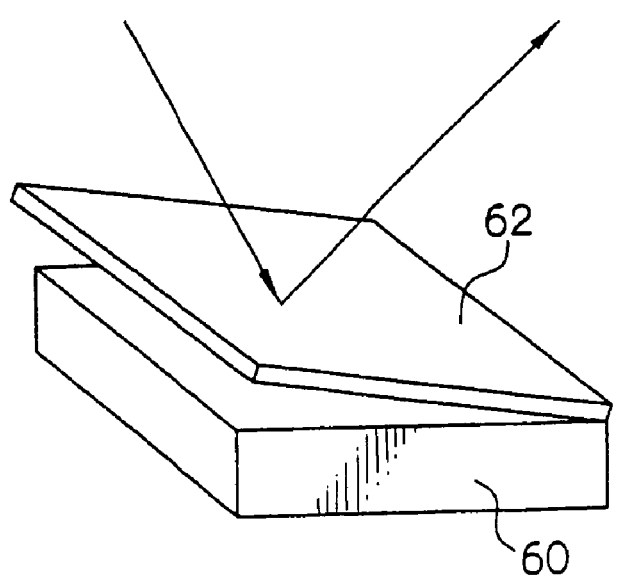

When a digital signal is written to the SRAM cell 60 of the DMD 110, the micromirrors 62 supported by the supports are slanted in a range of ±α degrees (e.g., ±10 degrees) with respect to a substrate at which the DMD 110 is disposed around a diagonal. FIG. 4A shows a state where a micromirror 62 is slanted at +α degrees, which is an ON state, and FIG. 4B shows a state where a micromirror 62 is slanted at −α degrees, which is an OFF state. Thus, by controlling the inclination of the micromirrors 62 of the pixels of the DMD 110 in correspondence to an image signal as shown in FIG. 3, the light incident at the DMD 110 is reflected in the respective directions in which the micromirrors 62 are slanted.

It should be noted that FIG. 3 shows an example where part of the DMD 110 is enlarged and where the micromirrors 62 are controlled to have inclinations of +α degrees or −α degrees. The ON-OFF control of the micromirrors 62 is conducted by the unillustrated controller connected to the DMD 110. A light absorber (not shown) is disposed in the direction in which the light beams are reflected by the micromirrors 62 in the OFF state.

As shown in FIG. 5A, the fiber array light source 112 is provided with plural (twenty-five in the drawing) laser modules 64, and ends of multimode optical fibers 30 are coupled to the laser modules 64. Coupled to the other ends of the multimode optical fibers 30 are optical fibers 31 whose core diameter is the same as that of the multimode optical fibers 30 and whose clad diameter is smaller than that of the multimode optical fibers 30. As shown in FIG. 5B, emission end portions (light-emitting points) of the optical fibers 31 are arranged in plural rows (three in the drawing) along a predetermined direction to configure a laser emission portion 68.

The multimode optical fibers 30 and the optical fibers 31 may be any of step-index optical fibers, graded-index optical fibers and complex optical fibers. For example, the step-index optical fibers manufactured by Mitsubishi Cable Industries, Ltd. can be used. In the present embodiment, the multimode optical fibers 30 and the optical fibers 31 are step-index optical fibers. With respect to the multimode optical fibers 30, the clad diameter is 125 μm, the core diameter is 50 μm, the NA is 0.2 and the transmittance of the incident-end surface coat is 99.5% or higher, and with respect to the optical fibers 31, the clad diameter is 60 μm, the core diameter is 50 μm and the NA is 0.2.

However, the clad diameter of the optical fibers 31 is not limited to 60 μm. The clad diameter of optical fibers used in conventional fiber light sources is 125 μm, but because the focal depth becomes deeper the smaller the clad diameter becomes, the clad diameter of the multimode optical fibers is preferably 80 μm or less, more preferably 60 μm or less, and even more preferably 40 μm or less. Also, because it is necessary for the core diameter to be at least 3 to 4 μm, the clad diameter of the optical fibers 31 is preferably 10 μm or greater.

Figure 10:
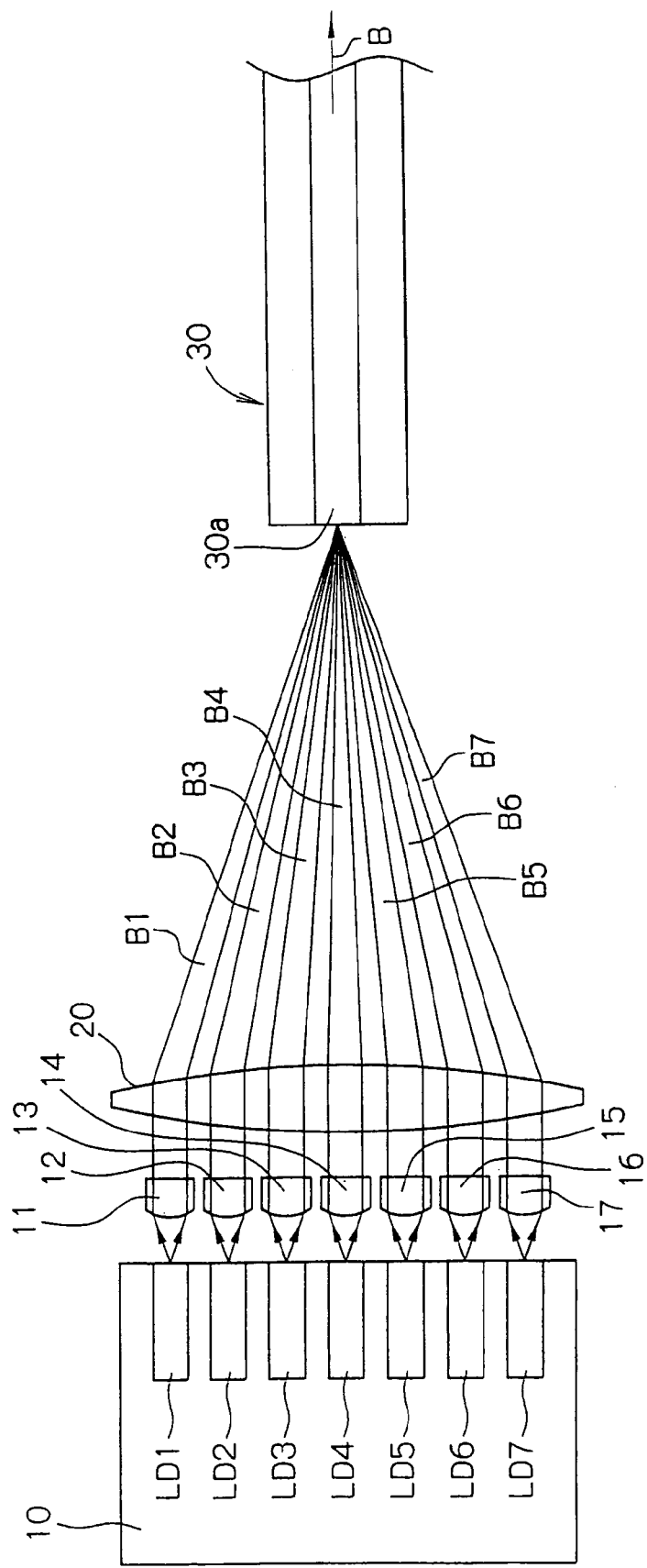
FIG. 10 is a plan view showing the configuration of a multiplex laser light source.

The laser modules 64 are configured by a multiplex laser light source (fiber light source) shown in FIG. 10. The multiplex laser light source is configured by plural (e.g., seven) chip-like horizontal multimode or single-mode GaN semiconductor lasers LD1, LD2, LD3, LD4, LD5, LD6 and LD7 that are arranged and fixed on a heat block 10, collimator lenses 11, 12, 13, 14, 15, 16 and 17 that are disposed in correspondence to the GaN semiconductor lasers LD1 to LD7, one condenser lens 20, and one multimode optical fiber 30. It should be noted that the number of the semiconductor lasers is not limited to seven. For example, it is possible to make twenty semiconductor laser beams incident at a multimode optical fiber whose clad diameter is 60 μm, whose core diameter is 50 μm and whose NA is 0.2, so that the necessary light amount of the irradiation head can be realized and the number of optical fibers can be further reduced.

The emission wavelengths of the GaN semiconductor lasers LD1 to LD7 are all the same (e.g., 405 nm), and the maximum outputs are all the same (e.g., 100 mW with a multimode laser and 30 mW with a single-mode laser). It should be noted that lasers having emission wavelengths in a wavelength range of 350 nm to 450 nm other than 405 nm may also be used as the GaN semiconductor lasers LD1 to LD7. The preferable wavelength range will be described later.

Figure 11:
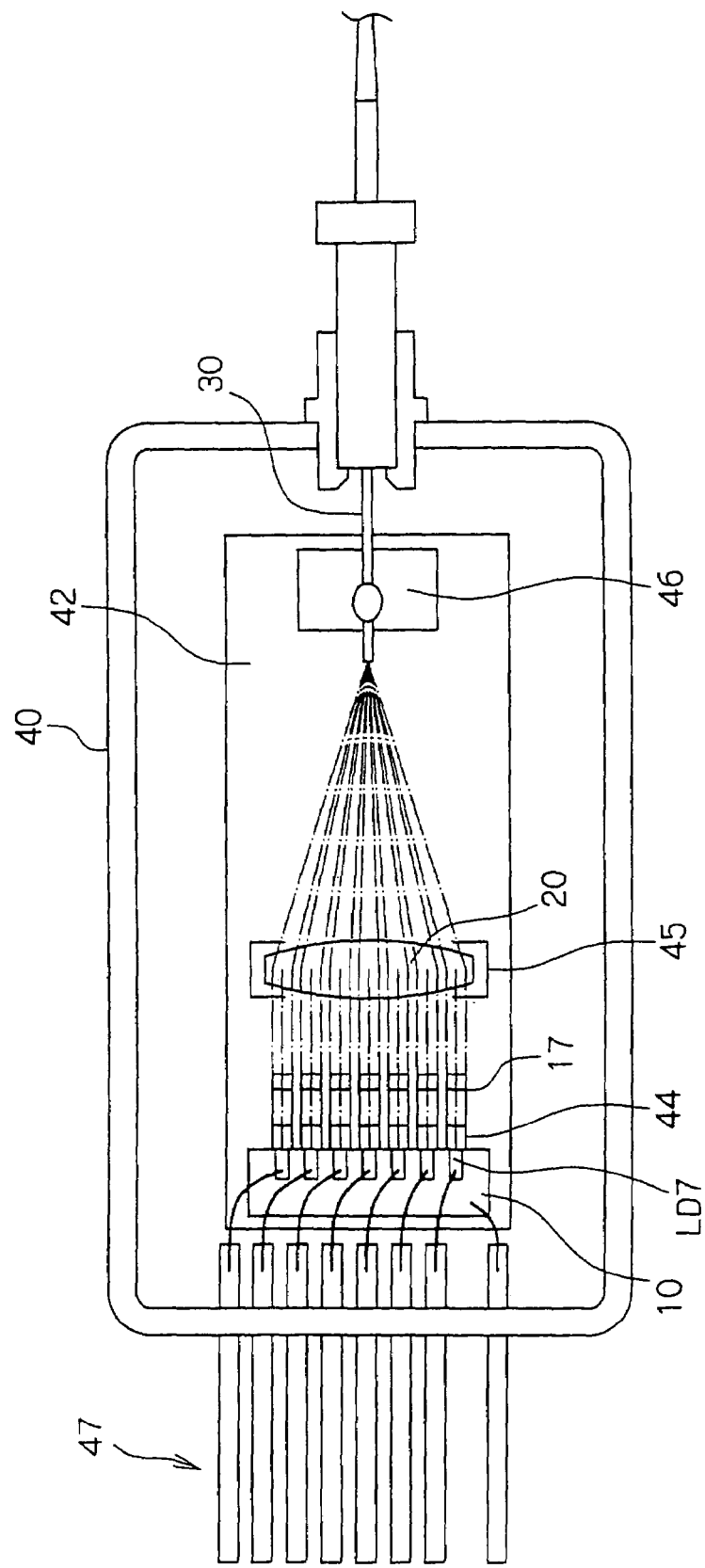
FIG. 11 is a plan view showing the configuration of a laser module.
Figure 12:
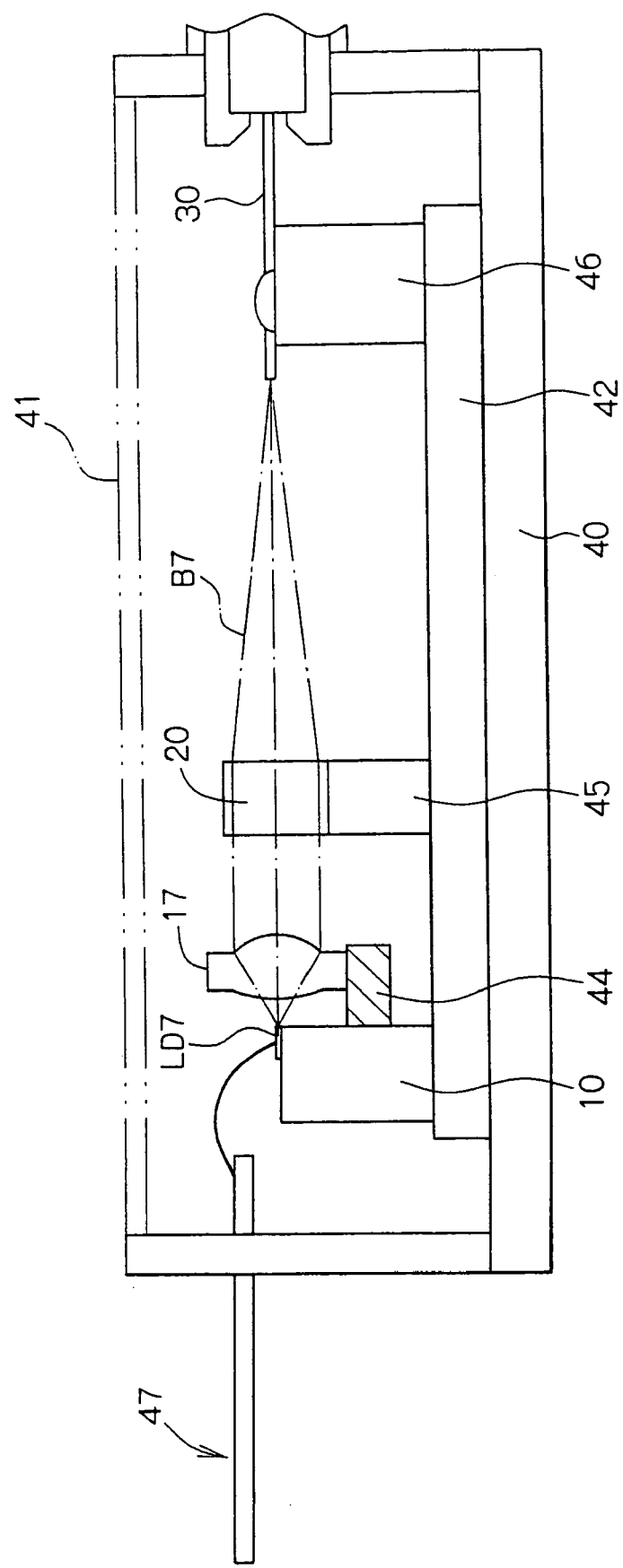
FIG. 12 is a side view showing the configuration of the laser module shown in FIG. 11.

As shown in FIGS. 11 and 12, the multiplex laser light source is accommodated, together with other optical system elements, inside a box-like package 40 whose top is open. The package 40 is provided with a package lid 41 created so as to close off the opening. After the package 40 is deaerated, a sealing gas is introduced and the opening of the package 40 is closed off by the package lid 41, whereby the multiplex laser light source is sealed, so as to be airtight, inside a closed space (sealed space) formed by the package 40 and the package lid 41.

A base plate 42 is fixed to a bottom surface of the package 40, and attached to an upper surface of the base plate 42 are the heat block 10, a condenser lens holder 45 that holds the condenser lens 20, and a fiber holder 46 that holds the incident-end portion of the multimode optical fiber 30. The emission-end portion of the multimode optical fiber 30 is pulled out to the outside of the package through an opening formed in a wall of the package 40.

A collimator lens holder 44 that holds the collimator lenses 11 to 17 is attached to a side surface of the heat block 10. An opening is formed in a side wall of the package 40, and a wiring 47 that supplies a drive current to the GaN semiconductor lasers LD1 to LD7 is pulled out to the outside of the package through this opening.

It should be noted that, in order to avoid complexity in FIG. 12, a reference numeral is given only to the GaN semiconductor laser LD7 of the plural GaN semiconductor lasers, and a reference numeral is given only to the collimator lens 17 of the plural collimator lenses.

Figure 13:
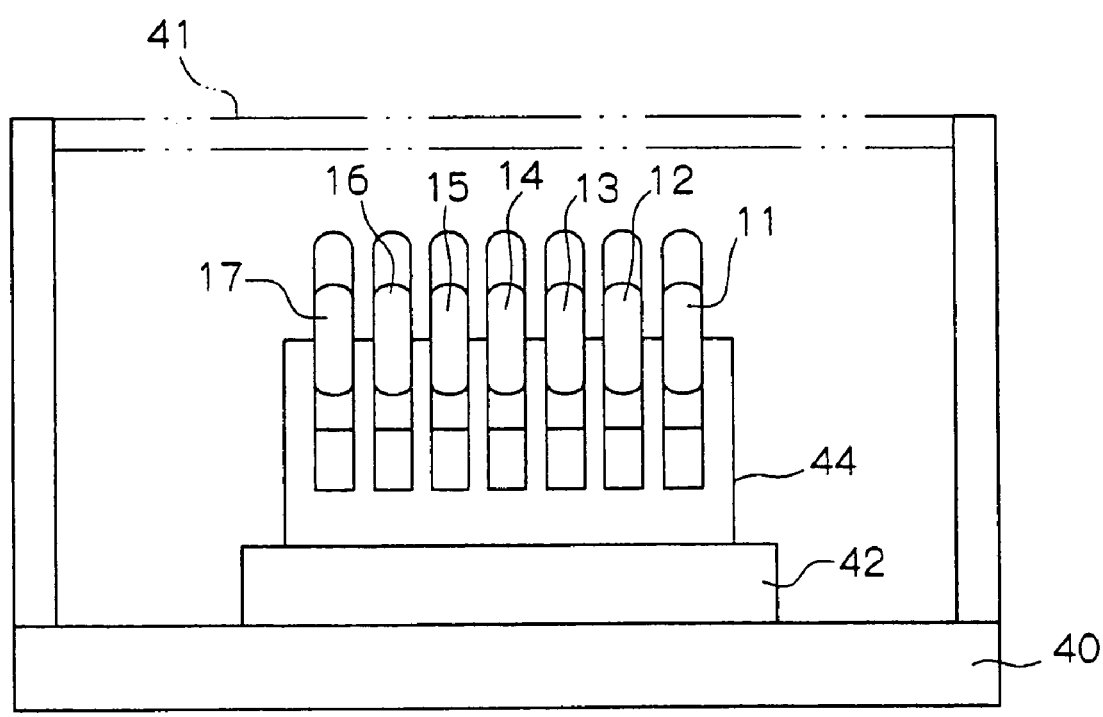
FIG. 13 is a partial side view showing the configuration of the laser module shown in FIG. 11.

FIG. 13 shows the front shape of the attachment portion of the collimator lenses 11 to 17. The collimator lenses 11 to 17 are formed in shapes where regions including optical axes of circular lenses having aspherical surfaces are slenderly cut by parallel planes. The slender-shaped collimator lenses can be formed by molding resin or optical glass, for example. The collimator lenses 11 to 17 are tightly disposed in the arrangement direction of the light-emitting points of the GaN semiconductor lasers LD1 to LD7 so that the length direction is orthogonal to the arrangement direction (left-right direction of FIG. 13) of the light-emitting points.

Lasers provided with active layers whose emission width is 2 µm, and which respectively emit laser beams B1 to B7 in a state where the divergence angles of a direction parallel to and a direction orthogonal to the active layers are respectively 10° and 30°, are used as the GaN semiconductor lasers LD1 to LD7. These GaN semiconductor lasers LD1 to LD7 are disposed so that the light-emitting points thereof are lined up in one row in the direction parallel to active layers.

Thus, the laser beams B1 to B7 emitted from the respective light-emitting points are incident to the slender-shaped collimator lenses 11 to 17 in a state where the direction in which the divergence angle is large matches the length direction and the direction in which the divergence angle is small matches the width direction (direction orthogonal to the length direction). In this case, the width of each of the collimator lenses 11 to 17 is 1.1 mm and the length of each of the collimator lenses 11 to 17 is 4.6 mm. The beam diameters of the laser beams B1 to B7 incident at these collimator lenses 11 to 17 in the horizontal direction and the vertical direction are 0.9 mm and 2.6 mm, respectively. Also, with respect to each of the collimator lenses 11 to 17, the focal distance $f_1$ is 3 mm, the NA is 0.6 and the lens disposition pitch is 1.25 mm.

The condenser lens 20 is formed in a shape that is long in the arrangement direction of the collimator lenses 11 to 17, i.e. the horizontal direction and short in the direction orthogonal thereto, and is formed in a shape where a region including the optical axis of a circular lens having an aspherical surface is slenderly cut by parallel planes. With respect to the condenser lens 20, the focal distance $f_2$ is 23 mm and the NA is 0.2. The condenser lens 20 is also formed by molding resin or optical glass, for example.

In the fiber array light source 66 configured in this manner, the laser beams B1, B2, B3, B4, B5, B6 and B7 emitted in a dispersed light state from the GaN semiconductor lasers LD1 to LD7 configuring the multiplex laser light source are made parallel by the corresponding collimator lenses 11 to 17. The parallel laser beams B1 to B7 are condensed by the condenser lens 20 and converge at the incident-end surface of a core 30a of the multimode optical fiber 30.

A condenser optical system is configured by the collimator lenses 11 to 17 and the condenser lens 20, and a multiplex optical system is configured by this condenser optical system and the multimode optical fiber 30. Thus, the laser beams B1 to B7 condensed as described above by the condenser lens 20 are incident at the core 30a of the multimode optical fiber 30, propagate through the inside of the optical fiber, are multiplexed into one laser beam B and emitted from the optical fiber 31 coupled to the emission-end portion of the multimode optical fiber 30.

In each laser module, in a case where the coupling efficiency of the laser beams B1 to B7 to the multimode optical fiber 30 is 0.85 and each output of the GaN semiconductor lasers LD1 to LD7 is 30 mW (in a case where single-mode lasers are used), a multiplexed laser beam B with an output of 180 mW (=30 mW×0.85×7) can be obtained in regard to each of the optical fibers 31 arranged in an array. Thus, the output of the laser emission portion 68 where twenty-five optical fibers 31 are arranged in an array is about 4.5 W (=180 mW×25).

High-luminance light-emitting points are arranged in the main scanning direction in the laser emission portion 68 of the fiber array light source 66. Because a conventional fiber light source, where laser light from a single semiconductor laser is coupled to one optical fiber, has a low output, a desired output could not be obtained without arranging numerous rows; however, because the multiplex laser light source used in the present embodiment has a high output, a desired output can be obtained even with few rows, e.g., one row. In the exposure device of the present embodiment, the diameter of the light-emitting region of the fiber array light source 112 is small. Therefore, the angles of the beams that pass through the lens system 114 and then are incident at the DMD 110 become small and, as a result, the angles of the beams incident at the evanescent array head 132 become small. Thus, because the beams can be condensed on the evanescent array head 132 to sufficiently small spot diameters and the focal depth can be increased, high-efficiency optical coupling to the evanescent array head 132 is possible.

For example, in a conventional fiber light source where semiconductor lasers and optical fibers are coupled one to one, a laser whose output is about 30 mW (milliwatts) is ordinarily used as the semiconductor lasers. In this case, a multimode optical fiber whose core diameter is 50 µm, whose clad diameter is 125 µm and whose NA (numerical aperture) is 0.2 can be used as the optical fibers. In order to obtain an output of about 4.5 W (Watts) 225 (15×15) multimode optical fibers must be bundled together. The area of the light-emitting region is 3.6 mm$^2$ (1.9 mm×1.9 mm). Thus, the luminance at the laser emission portion 68 is 1.25 (W/mm$^2$) and the luminance per optical fiber is 10 (W/mm$^2$).

In contrast, in the present embodiment, as described above, an output of about 4.5 W can be obtained with twenty-five multimode optical fibers, and the area of the light-emitting region at the laser emission portion 68 is 0.2 mm$^2$ (0.18 mm×1.13 mm). Thus, the luminance at the laser emission portion is 22.5 (W/mm$^2$), so that the luminance becomes about 18 times higher in comparison to the conventional fiber light source. Also, the luminance per optical fiber is 90 (W/mm$^2$), so that the luminance becomes about 9 times higher in comparison to the conventional fiber light source.

A blue laser having an emission wavelength in the vicinity of 400 nm is preferable for the semiconductor lasers configuring the multiplex laser light source. By using a blue laser, the condensed beams of the microlens array 130 can be narrowed. As a result, the light can be coupled with a high efficiency to the array head, and high-intensity light can be supplied to the array head. Also, even in an evanescent array head with ten million pixels, the condensed beams of the microlens array can be narrowed, and high-intensity light can be introduced to the array head. Thus, the light intensity of one pixel can also be made into a sufficiently practical value.

It should be noted that, although an example has been described where the light from the single-mode lasers is multiplexed, it is also possible to obtain an even higher luminance light source output by multiplexing and coupling light from multimode high-output lasers (e.g., 200 mW). For example, in a case where the outputs of the multimode lasers are 200 mW, a multiplexed laser beam B with an output of 1 W (=200 mW×0.85×6) can be obtained in regard to each of the optical fibers 31 arranged in an array. Thus, the output at the laser emission portion 68 where five optical fibers 31 are arranged in an array is about 5 W (=1 W×5).

In the above description, a case has been described where plural semiconductor lasers are multiplexed. However, without multiplexing, one-to-one coupling may be provided between the semiconductor lasers and optical fibers whose clad diameter is small (e.g., 60 μm clad diameter, with the core diameters being equivalent), similarly to a case where plural semiconductor lasers are multiplexed. Particularly in this case, it is preferable to use multimode high-output lasers (200 mW) as the semiconductor lasers. By using high-output lasers, a high-intensity light source can be obtained. As for the luminance in this case, because the light-emitting area can be made ¼ with respect to that of a structure where the semiconductor lasers and the optical fibers are coupled one to one, a luminance of four times higher can be realized.

(Operation of the Exposure Device)

Next, the operation of the exposure device will be described. In the exposure device, when image data is inputted to the unillustrated controller, the controller generates the control signals that drive/control the micromirrors of the DMD 110 on the basis of the inputted image data, and the controller controls the angles of the reflection surfaces of the micromirrors of the DMD 110 on the basis of the generated control signals.

The illumination light that is irradiated onto the DMD 110 via the lens system 114 from the light source 112 is reflected in predetermined directions in correspondence to the angles of the reflection surfaces of the micromirrors and modulated, and the modulated light is magnified by the magnification lens systems 126 and 128. The light magnified by the magnification lens systems 126 and 128 is incident at the microlenses disposed in the microlens array 130.

The light condensed by the microlens array 130 is incident at the corresponding cores 140 arranged in a matrix in the evanescent array head 132 and is guided through the insides of the optical fibers 136. Because the light condensed by the microlens array 130 is incident at the cores 140 corresponding to the microlenses, the light can be efficiently incident. Also, as described above, the condensed spots of the light beams incident at the evanescent array head 132 can be made smaller, and eclipse is reduced and coupling efficiency becomes higher by increasing the focal depth. Evanescent light leaks out from the micro-openings formed in the emission-side end portions 138 of the optical fibers 136, and the photosensitive material 134 is exposed by this evanescent light.

The beam diameters of the light beams condensed by the microlens array 130 are preferably made the same size as the diameters of the cores 140 of the optical fibers 136. By making the beam diameters of the light beams the same size as the diameters of the cores 140, the coupling efficiency of the light beams to the optical fibers 136 becomes higher. For example, in a case where single-mode fibers with a core diameter of 4 μm are used, the beam diameters of the optical fibers are matched with those of the condensed beams in order to realize a high coupling efficiency, and the beam diameters of the condensed light beams are also made 4 μm in order to improve mode matching.

As described above, in the exposure device of the present embodiment, the microlenses of the microlens array are disposed in correspondence to the pixel portions of the DMD and the optical fiber cores of the evanescent array head are arranged in correspondence to the microlenses arranged in the microlens array. Thus, the light that is modulated by the DMD and condensed by the microlenses can be efficiently incident at the corresponding optical fiber cores. Therefore, it is possible to conduct digital exposure with high precision and with a high light-use efficiency using evanescent light.

In particular, because a high-luminance light source is used in the present embodiment, the focal depth of the light beams incident at the evanescent array head can be increased. Thus, eclipse of the optical fiber cores is reduced and coupling efficiency becomes higher.

[Second Embodiment]

Figure 6:
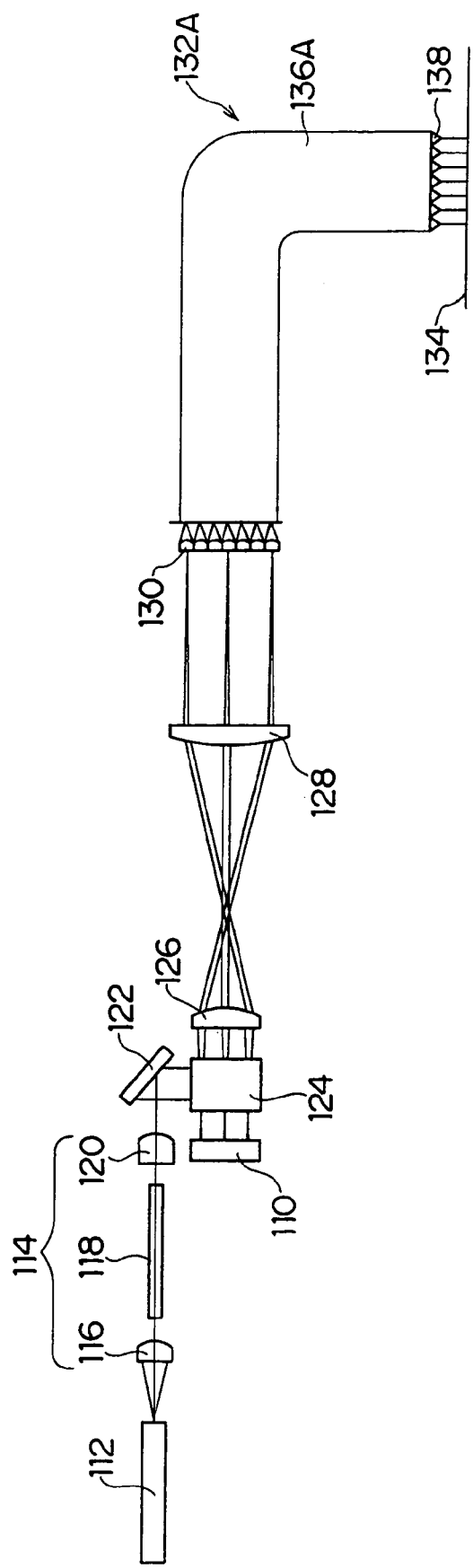
FIG. 6 is a cross-sectional view, along an optical axis, showing the configuration of an exposure device according to a second embodiment.

As shown in FIG. 6, an exposure device according to a second embodiment of the present invention has the same configuration as that of the exposure device of the first embodiment except that, in the exposure device of the second embodiment, the length of the optical fibers of the evanescent array head is increased. Thus, identical reference numerals and symbols will be given to the constituent portions that are the same, and description of those constituent portions will be omitted.

Similar to the evanescent array head 132 shown in FIG. 2, an evanescent array head 132A is provided with cores 140, claddings 142 and tapered emission-side end portions 138 in which micro-openings are formed, but the evanescent array head 132A uses optical fibers 136A that are longer than the optical fibers 136. The incident ends of the optical fibers 136A are fixedly disposed at predetermined positions so that the cores 140 are arranged in a matrix in correspondence to the condensing positions of the microlens array 130. The emission-side end portions 138 of the optical fibers 136A in which the micro-openings are formed are disposed adjacent to the surface of the photosensitive material 134 and configured to be movable along the surface of the photosensitive material 134.

In this exposure device, when image data is inputted to the unillustrated controller, the angles of the reflection surfaces of the micromirrors of the DMD 110 are controlled on the basis of the image data. The illumination light irradiated onto the DMD 110 via the lens system 114 from the light source 112 is reflected in predetermined directions in correspondence to the angles of the reflection surfaces of the micromirrors and modulated. The modulated light is magnified by the magnification lens systems 126 and 128 and is incident at the microlenses disposed in the microlens array 130.

The light condensed by the microlens array 130 is incident at the corresponding cores disposed in a matrix in the evanescent array head 132A and is guided through the insides of the optical fibers 136A. Then, evanescent light leaks out from the micro-openings formed in the emission-side end portions of the optical fibers 136A, and the photosensitive material 134 is exposed by this evanescent light.

As described above, in the present embodiment, because the incident end of the evanescent array head is fixedly disposed at predetermined position, similar to the first embodiment, the light that is modulated by the DMD and condensed by the microlenses can be efficiently incident at the corresponding optical fiber cores. Therefore, digital exposure can be conducted with high precision and with a high light-use efficiency using evanescent light. Also, because an evanescent array head provided with long optical fibers is used, the degree of spatial freedom of the emission ends of the evanescent array head can be improved, and the weight of the evanescent array head portion can be reduced. Also, positioning of the evanescent array head with ultra-high precision in nanometers (nm) and precise control of the gap with the surface of the photosensitive material with ultrahigh precision in nanometers (nm) can be easily realized. Moreover, the evanescent array head can be freely moved along the surface of the photosensitive material with ultrahigh precision.

[Third Embodiment]

Figure 7:
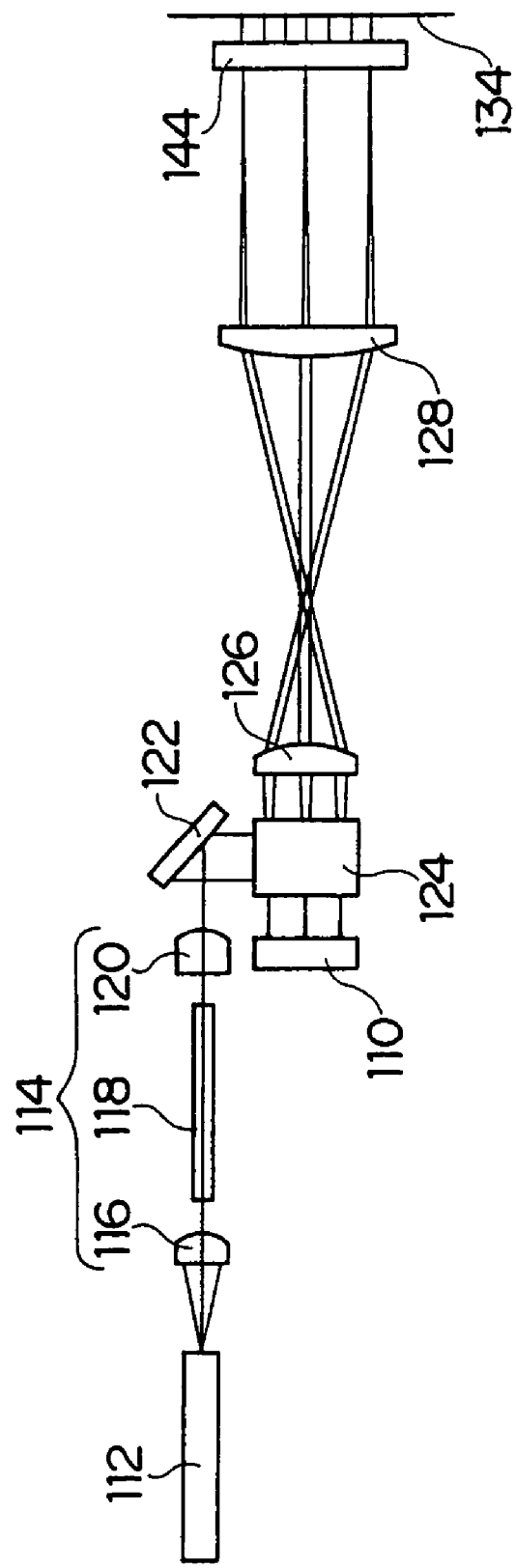
FIG. 7 is a cross-sectional view, along an optical axis, showing the configuration of an exposure device according to a third embodiment.

As shown in FIG. 7, an exposure device according to a third embodiment of the present invention has the same configuration as that of the exposure device of the first embodiment except that, in the exposure device of the third embodiment, an evanescent array head where micro-openings and a light-blocking film are disposed in the microlens array is used. Thus, identical reference numerals and symbols will be given to the constituent portions that are the same, and description of those constituent portions will be omitted.

Figure 8:
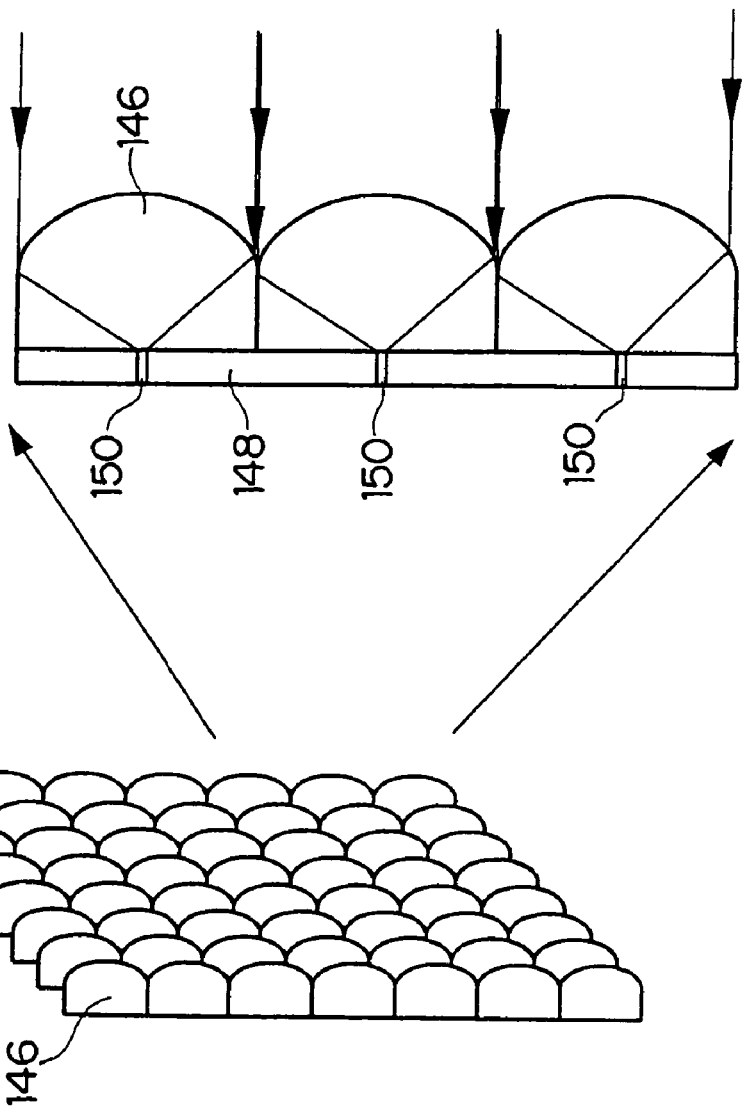
FIG. 8A is a perspective view showing the configuration of an evanescent array head used in the exposure device shown in FIG. 7.
FIG. 8B is a cross-sectional view along the optical axis of FIG. 8A.

An evanescent array head 144 is disposed at a position where the DMD image is imaged by the magnification lens systems 126 and 128 and disposed adjacent to the surface of the photosensitive material 134. Also, as shown in FIGS. 8A and 8B, the evanescent array head 144 is provided with a microlens array 146 where the microlenses are disposed in correspondence to the pixels of the DMD. A light-blocking film 148 is disposed on a light emitting-side surface of the microlens array 146, and micro-openings 150 are provided at condensing positions of the microlenses of the light-blocking film 148. The diameters of the micro-openings 150 are substantially 100 nm. When laser light is incident at the microlens array 146, evanescent light leaks out from the micro-openings.

The evanescent array head 144 can be easily manufactured by depositing a thin film of metal such as aluminium on the light-emitting surface of the microlens array 146, forming the light-blocking film 148, making high-output laser light incident at the microlenses and forming the micro-openings 150 at focal positions.

In this exposure device, when image data is inputted to the unillustrated controller, the angles of the reflection surfaces of the micromirrors of the DMD 110 are controlled on the basis of the image data. The illumination light irradiated onto the DMD 110 via the lens system 114 from the light source 112 is reflected in predetermined directions in correspondence to the angles of the reflection surfaces of the micromirrors and modulated. The modulated light is magnified by the magnification lens systems 126 and 128 and is incident at the microlenses disposed in the microlens array 146 of the evanescent array head 144. The light incident at the microlens array 146 is condensed in the vicinity of the micro-openings 150 formed in the light-blocking film 148. Evanescent light leaks out from the micro-openings 150, and the photosensitive material 134 is exposed by this evanescent light.

As described above, in the exposure device of the present embodiment, because the microlenses of the microlens array are arranged in correspondence to the pixel portions of the DMD and the microlens array is used as part of the evanescent array head, digital exposure can be conducted with high precision and with a high light-use efficiency using evanescent light.

Also, because an evanescent array head configured by a microlens array that can be manufactured using a semiconductor process is used instead of an evanescent array head using fibers, fine pixel pitch thereof can be attained with higher precision. As a result, the array number can be easily increased to one million pixels or ten million pixels, and an evanescent array head with an even higher resolution can be realized. Moreover, because a semiconductor process can be used, an evanescent array head whose configuration is simple with fewer components and which has excellent mass-productivity, can be realized.

[Fourth Embodiment]

Figure 9:
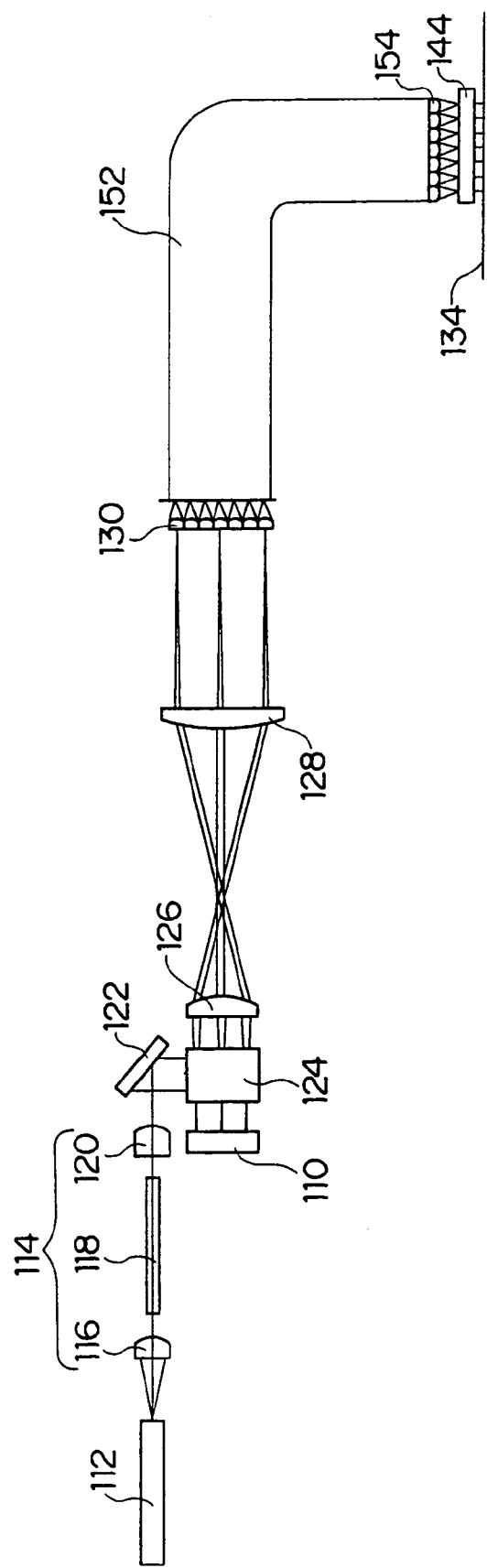
FIG. 9 is a cross-sectional view, along an optical axis, showing the configuration of an exposure device according to a fourth embodiment.

As shown in FIG. 9, an exposure device according to a fourth embodiment of the present invention has the same configuration as that of the exposure device of the first embodiment except that, in the exposure device of the fourth embodiment, light guided through long optical fibers is incident at an evanescent array head where micro-openings and a light-blocking film are disposed in the microlens array. Thus, identical reference numerals and symbols will be given to the constituent portions that are the same, and description of those constituent portions will be omitted.

A light guide 152 configured by plural optical fibers that are bundled together is disposed at the light-emitting side of the microlens array 130. At the incident end of the light guide 152, the cores of the optical fibers are arranged in a matrix in correspondence to the condensing positions of the microlenses of the microlens array 130. A microlens array 154 is disposed at the light-emitting side of the light guide 152.

The incident end of the light guide 152 is fixedly disposed at a predetermined position so that the cores are arranged in a matrix in correspondence to the condensing positions of the microlens array 130. The emission end of the light guide 152 is configured to be movable.

The microlenses of the microlens array 154 are arranged in a matrix in correspondence to the cores of the optical fibers at the emission end of the light guide 152. The evanescent array head 144 shown in FIGS. 8A and 8B is disposed at a position where the DMD image is imaged by the microlens array 154.

In this exposure device, when image data is inputted to the unillustrated controller, the angles of the reflection surfaces of the micromirrors of the DMD 110 are controlled on the basis of the image data. The illumination light irradiated onto the DMD 110 via the lens system 114 from the light source 112 is reflected in predetermined directions in correspondence to the angles of the reflection surfaces of the micromirrors and modulated, and the modulated light is magnified by the magnification lens systems 126 and 128 and made incident at the microlenses disposed in the microlens array 130.

The light condensed by the microlens array 130 is incident at the optical fibers configuring the light guide 152, guided through the insides of the optical fibers and emitted.

The light emitted from the light guide 152 is condensed by the microlenses of the microlens array 154 and is incident at the microlenses disposed in the microlens array 146 of the evanescent array head 144. The light incident at the microlens array 146 is condensed in the vicinity of the micro-openings 150 formed in the light-blocking film 148. Evanescent light leaks out from the micro-openings 150, and the photosensitive material 134 is exposed by this evanescent light. Particularly in a case where the pitch of the microlens array 146 is made small, the clad diameter of the light-guide fibers can be reduced to about 10 μm, and it is possible to increase the density.

As described above, in the exposure device of the present embodiment, the microlenses of a first microlens array are arranged in correspondence to the pixel portions of the DMD, the condensed beams of the microlenses are guided to the fiber bundle, the condensed beams are incident to an evanescent array head by using a second microlens array where microlenses are disposed in correspondence to the condensed beams, and a third microlens array is used as the evanescent array head. Thus, digital exposure can be conducted with high precision and with a high light-use efficiency using evanescent light.

In the exposure device of the present embodiment, the beams condensed by the second microlens array are incident to the evanescent array head which is configured by the third microlens array and which is provided with the light-blocking film having micro-openings in the vicinity of the light condensing positions, and exposure is conducted using evanescent light leaking out from the evanescent array head. However, the light-blocking film having micro-openings may be provided to the second microlens array, and the second microlens array may be used as the evanescent array head.

Because an evanescent array head provided with long optical fibers is used, the degree of spatial freedom of the emission ends of the evanescent array head can be improved, and the weight of the evanescent array head portion can be reduced. Also, positioning of the evanescent array head with ultrahigh precision in nanometers (nm) and precise control of the gap with the surface of the photosensitive material with ultrahigh precision in nanometers (nm) can be easily realized. Moreover, the evanescent array head can be freely moved along the surface of the photosensitive material with ultrahigh precision.

Also, because an evanescent array head configured by a microlens array that can be manufactured using a semiconductor process is used instead of an evanescent array head using fibers, the pixel pitch thereof can be finely made with higher precision. As a result, the array number can be easily increased to one million pixels or ten million pixels, and an evanescent array head with an even higher resolution can be realized. Moreover, because a semiconductor process can be used, an evanescent array head whose configuration is simple with fewer components and which has excellent mass-productivity can be realized.

It should be noted that, in the exposure device of the present invention, the incident ends of plural optical fibers can be fixedly disposed, and the emission ends of the plural optical fibers can be made movable. For example, the incident ends of the optical fibers can be fixedly disposed and the emission ends can be made movable by increasing the length of the optical fibers.

According to the exposure device of the present invention, the effect that digital exposure can be conducted with high precision and with a high light-use efficiency using evanescent light is obtained.

What is claimed is:

1. An exposure method comprising:
   (a) emitting light beams from a light source;
   (b) irradiating the light beams to a spatial light modulator in which a plurality of pixel portions are arranged whose light modulation states change in correspondence to control signals;
   (c) in the spatial light modulator, optically modulating the irradiated light beams in correspondence to control signals at each of the plurality of pixel portions, and emitting the light beams;
   (d) irradiating the light beams that have been optically modulated and emitted from the spatial light modulator to a microlens array in which a plurality of microlenses are arranged at a pitch corresponding to the plurality of pixel portions and which condenses, per microlens, the light beams modulated by the pixel portions;
   (e) in the microlens array, condensing the light beams that have been modulated at the plurality of pixel portions of the spatial light modulator, per microlens;
   (f) making the light beams that have been condensed by the plurality of microlenses incident to incident ends of a plurality of optical fibers whose emission ends are tapered and which are arranged at a pitch corresponding to condensing positions of the plurality of microlenses; and
   (g) exposing a photosensitive material by evanescent light leaking out from the emission ends of the plurality of optical fibers.

2. The exposure method of claim 1,
   wherein the incident ends off the plurality of optical fibers are fixedly disposed and the emission ends of the plurality of optical fibers are movable, and
   exposing a photosensitive material (g) includes exposing by moving the photosensitive material and the emission ends of the plurality of optical fibers relative to each other.

3. The exposure method of claim 1, wherein the wavelength of the light beams is about 400 nm.

4. An exposure method comprising:
   (a2) emitting light beams from a light source;
   (b2) irradiating the light beams to a spatial light modulator in which a plurality of pixel portions are arranged whose light modulation states change in correspondence to control signals;
   (c2) in the spatial light modulator, optically modulating the irradiated light beams in correspondence to control signals at each of the plurality of pixel portions, and emitting the light beams;
   (d2) irradiating the light beams that have been optically modulated and emitted from the spatial light modulator to a microlens array in which a plurality of microlenses are arranged at a pitch corresponding to the plurality of pixel portions and which condenses, per microlens, the light beams modulated by the pixel portions;
   (e2) in the microlens array, condensing the light beams that have been modulated at the plurality of pixel portions of the spatial light modulator, per microlens;
   (f2) making the light beams that have been condensed by the plurality of microlenses incident to a plurality of micro-openings which are arranged at a pitch corresponding to condensing positions of the plurality of microlenses, in a light-blocking film disposed on a light-emitting surface of the microlens array; and
   (g2) exposing a photosensitive material by evanescent light leaking out from the plurality of micro-openings.

5. The exposure method of claim 4, wherein the wavelength of the light beams is about 400 nm.

6. An exposure method comprising:
(a3) emitting light beams from a light source;
(b3) irradiating the light beams to a spatial light modulator in which a plurality of pixel portions are arranged whose light modulation states change in correspondence to control signals;
(c3) in the spatial light modulator, optically modulating the irradiated light beams in correspondence to control signals at each of the plurality of pixel portions, and emitting the light beams;
(d3) irradiating the light beams that have been optically modulated and emitted from the spatial light modulator to a first microlens array in which a plurality of first microlenses are arranged at a pitch corresponding to the plurality of pixel portions and which condenses, per first microlens, the light beams that have been modulated by the pixel portions;
(e3) in the first microlens array, condensing the light beams that have been modulated at the pixel portions of the spatial light modulator, per first microlens;
(f3) making the light beams that have been condensed by the plurality of first microlenses incident to incident ends of a plurality of optical fibers which are arranged at a pitch corresponding to condensing positions of the plurality of first microlenses;
(g3) irradiating the light beams that have been emitted from the plurality of optical fibers to a second microlens array in which a plurality of second microlenses are arranged at a pitch corresponding to emission ends of the plurality of optical fibers and which condenses, per second microlens, the light beams that have been emitted from the plurality of optical fibers;
(h3) in the second microlens array, condensing the light beams that have been emitted from the plurality of optical fibers, per second microlens;
(i3) making the light beams that have been condensed by the plurality of second microlenses incident to a plurality of micro-openings which are arranged at a pitch corresponding to condensing positions of the plurality of second microlenses, in a light-blocking film disposed on a light-emitting surface of the second microlens array; and
(j3) exposing a photosensitive material by evanescent light leaking out from the plurality of micro-openings.

7. The exposure method of claim 6, wherein the wavelength of the light beams is about 400 nm.

8. An exposure method comprising:
(a4) emitting light beams from a light source;
(b4) irradiating the light beams to a spatial light modulator in which a plurality of pixel portions are arranged whose light modulation states change in correspondence to control signals;
(c4) in the spatial light modulator, optically modulating the irradiated light beams in correspondence to control signals at each of the plurality of pixel portions, and emitting the light beams;
(d4) irradiating the light beams that have been optically modulated and emitted from the spatial light modulator to a first microlens array in which a plurality of first microlenses are arranged at a pitch corresponding to the plurality of pixel portions and which condenses, per first microlens, the light beams that have been modulated by the pixel portions;
(e4) in the first microlens array, condensing the light beams that have been modulated at the pixel portions of the spatial light modulator, per first microlens;
(f4) making the light beams that have been condensed by the plurality of first microlenses incident to incident ends of a plurality of optical fibers which are arranged at a pitch corresponding to condensing positions of the plurality of first microlenses;
(g4) irradiating the light beams that have been emitted from the plurality of optical fibers to a second microlens array in which a plurality of second microlenses are arranged at a pitch corresponding to emission ends of the plurality of optical fibers and which condenses, per second microlens, the light beams that have been emitted from the plurality of optical fibers;
(h4) in the second microlens array, condensing the light beams that have been emitted from the plurality of optical fibers, per second micro lens;
(i4) irradiating the light beams that have been condensed by the plurality of second microlenses to a third microlens array in which a plurality of third microlenses are arranged at a pitch corresponding to condensing positions of the plurality of second microlenses and which condenses, per third microlens, the light beams that have been emitted from the plurality of second microlenses;
(j4) in the third microlens array, condensing the light beams that have been emitted from the second microlens array, per third microlens;
(k4) making the light beams that have been condensed by the plurality of third microlenses incident to a plurality of micro-openings which are arranged at a pitch corresponding to condensing positions of the plurality of third microlenses, in a light-blocking film disposed on a light-emitting surface of the third microlens array; and
(l4) exposing a photosensitive material by evanescent light leaking out from the plurality of micro-openings.

9. The exposure method of claim 8, wherein the wavelength of the light beams is about 400 nm.

* * * * *